(12) United States Patent
Higashi et al.

(10) Patent No.: US 6,996,889 B2
(45) Date of Patent: Feb. 14, 2006

(54) ELECTRONIC PART MOUNTING APPARATUS AND METHOD

(75) Inventors: Kazushi Higashi, Neyagawa (JP); Tatsuo Sasaoka, Osaka (JP); Satoshi Horie, Kadoma (JP); Takashi Omura, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 180 days.

(21) Appl. No.: 10/627,479

(22) Filed: Jul. 25, 2003

(65) Prior Publication Data
US 2004/0022037 A1 Feb. 5, 2004

(30) Foreign Application Priority Data
Aug. 1, 2002 (JP) ............................. 2002-224558

(51) Int. Cl.
*B23P 23/00* (2006.01)
(52) U.S. Cl. .................. 29/564.1; 29/564; 29/739; 29/740; 29/741
(58) Field of Classification Search ............ 29/564, 29/564.1, 739, 740, 741; 257/660; 228/180.22; 438/106, 110
See application file for complete search history.

(56) References Cited

U.S. PATENT DOCUMENTS

| | | | | |
|---|---|---|---|---|
| 5,564,159 A | * | 10/1996 | Treiber | 15/302 |
| 5,609,290 A | * | 3/1997 | Bobbio et al. | 228/206 |
| 6,227,436 B1 | * | 5/2001 | Nishikawa et al. | 228/180.22 |
| 6,245,189 B1 | * | 6/2001 | Rigali et al. | 156/345.54 |
| 6,392,286 B1 | * | 5/2002 | Jin et al. | 257/660 |
| 6,468,833 B1 | * | 10/2002 | Uner et al. | 438/115 |
| 6,551,860 B1 | * | 4/2003 | Uner et al. | 438/115 |
| 6,727,654 B1 | * | 4/2004 | Ogawa et al. | 315/111.01 |

FOREIGN PATENT DOCUMENTS

JP 3-241755 10/1991

OTHER PUBLICATIONS

"Development of chip-on-chip bonding process at a room temperature (with copper, a bumpless bonding is also possible)", Semiconductor Sangyo Newspaper, Jun. 12, 2002, p. 9, Sangyo Times Inc., Tokyo, Japan.
"Development of chip-on-chip bonding process at a room temperature by a superbonder", Electronic Materials, Jul. 1, 2002, pp. 8-9, vol. 41 No. 7, Kogyo Chosakai Publishing Co., Ltd., Tokyo, Japan.
"Ultrasonic Flip Chip Bonding Technology for LSI Chip with High Pin Counts" by Kajiwara et al., from Proceedings of the 7th Symposium on Microjoining and Assembly Technology in Electronics, Feb. 1, 2001, pp. 16166, Japan Welding Society, Tokyo, Japan.

\* cited by examiner

*Primary Examiner*—Carl J. Arbes
(74) *Attorney, Agent, or Firm*—Pearne & Gordon LLP

(57) ABSTRACT

An electronic part mounting apparatus includes a chamber for cleaning a substrate and an electronic part by plasma, a mounting mechanism for mounting the electronic part on the electronic part, and a conveying robot for conveying the substrate and the electronic part from the chamber to the mounting mechanism. After plasma cleaned, the substrate and the electronic part are swiftly conveyed to the mounting mechanism by the conveying robot. After the electronic part is mounted on the substrate by the mounting mechanism, the resultant combination of them is pulse heated. Therefore, the electronic part is appropriately mounted on the substrate in a state that those are exposed to the air. A part mounting mechanism is simplified.

7 Claims, 7 Drawing Sheets

ELECTRONIC PART MOUNTING APPARATUS AND METHOD

BACKGROUND OF THE INVENTION

The present invention relates to an apparatus and a method for mounting an electronic part on a substrate.

A technique is known in which the surfaces of objects to be bonded, such as an electronic part and a substrate, are cleaned by a plasma cleaning process to remove the absorbed materials from the surfaces of the objects and to activate the surfaces of the same, and then those objects are bonded together. The process of cleaning the objects to be bonded is carried out in a chamber in a high vacuum condition. The process of bonding of them is also carried out in the chamber to prevent the surfaces of them from being oxidized and contaminated.

To handle the objects to be bonded in a high vacuum condition in the chamber, it is necessary to make many improvements of the holders for the objects to be bonded and the drive mechanisms in the chamber. This results in increase of the cost to manufacture the part mounting apparatus. For example, in a high vacuum condition, it is impossible to hold the electronic part and the substrate as the objects to be bonded by using the normal suction attraction. Accordingly, the electrostatic attraction is necessarily used for holding the objects, instead. Further, it is necessary to use the guide mechanism or the like in the chamber which is designed specially for use in the high vacuum condition and expensive. Some sealing measure must be taken for the mechanism for driving a structure in the chamber from the outside.

SUMMARY OF THE INVENTION

It is, therefore, an object of the present invention to provide a technique which simplifies a construction of an electronic part mounting apparatus, and mounts an electronic part on a substrate at less cost by the utilization of the plasma cleaning process.

According to a broad aspect of the invention, there is provided an electronic part mounting apparatus for mounting an electronic part on a substrate, comprising: a chamber for cleaning a substrate and an electronic part by plasma; a conveying mechanism for conveying the substrate and the electronic part from the chamber into atmospheric air; a mounting mechanism for receiving the electronic part and the substrate from the conveying mechanism and for mounting the substrate on the electronic part in a state that the electronic part and the substrate are exposed in the atmospheric air.

In a preferred embodiment of the invention, the mounting mechanism includes a part holder for holding the electronic part, a substrate holder for holding the substrate, and a moving mechanism for moving the part holder relative to the substrate holder, and one of the part holder and the substrate holder includes a heating portion for heating objects to be held after the electronic part is mounted on the substrate.

In another preferred embodiment, heating operation of the heating portion is stopped in the middle of temperature increasing of the objects to be held.

In still another embodiment, both the part holder and the substrate holder include the heating portions.

In yet another embodiment, the electronic part mounting apparatus further comprises an ultrasonic vibration source for applying an ultrasonic vibration to the part holder.

According to another broad aspect of the invention, there is provided a method of mounting an electronic part on a substrate comprising the steps of: cleaning the substrate and the electronic part by plasma; and mounting the electronic part on the substrate in a state that the electronic part and the substrate are exposed in an atmospheric air.

In the part mounting method, the mounting step is executed within 10 minutes after the cleaning step is executed and the electronic part and the substrate are put in an atmospheric air.

Also in the part mounting method, the mounting step is executed within 5 minutes after the cleaning step is executed and the electronic part and the substrate are put in an atmospheric air.

In the part mounting method, the mounting step is executed within 3 minutes after the cleaning step is executed and the electronic part and the substrate are put in an atmospheric air.

Additionally, the part mounting method further comprises a step of heating either of the electronic part and the substrate after the cleaning step is executed.

DESCRIPTION OF THE PREFERRED EMBODIMENT

Hereinafter, an embodiment of the invention is explained with reference to the drawings.

Figure 1:
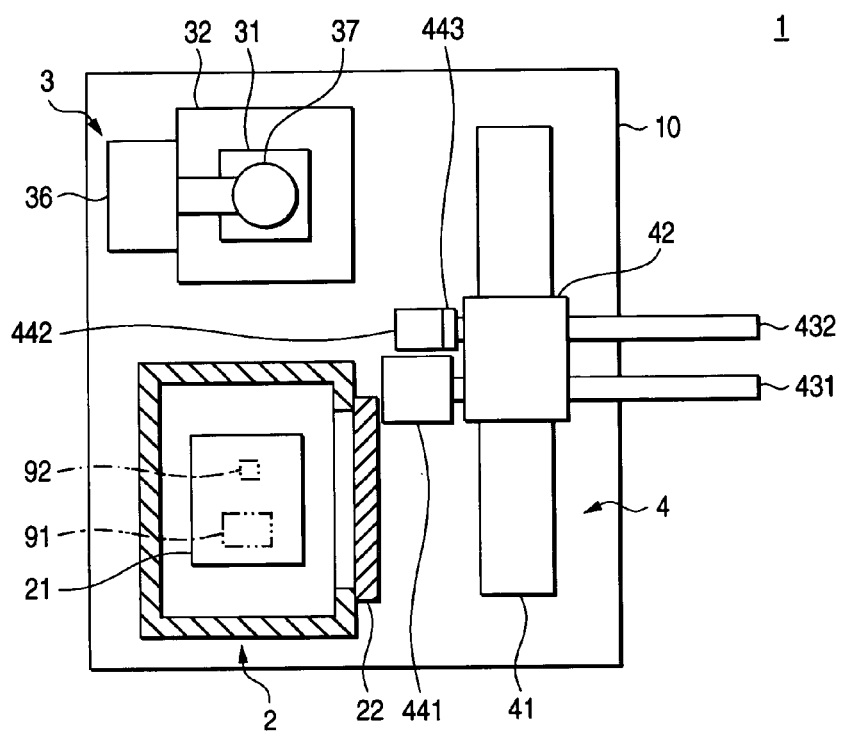
FIG. 1 is a plan view showing a construction of an electronic part mounting apparatus.
Figure 2:
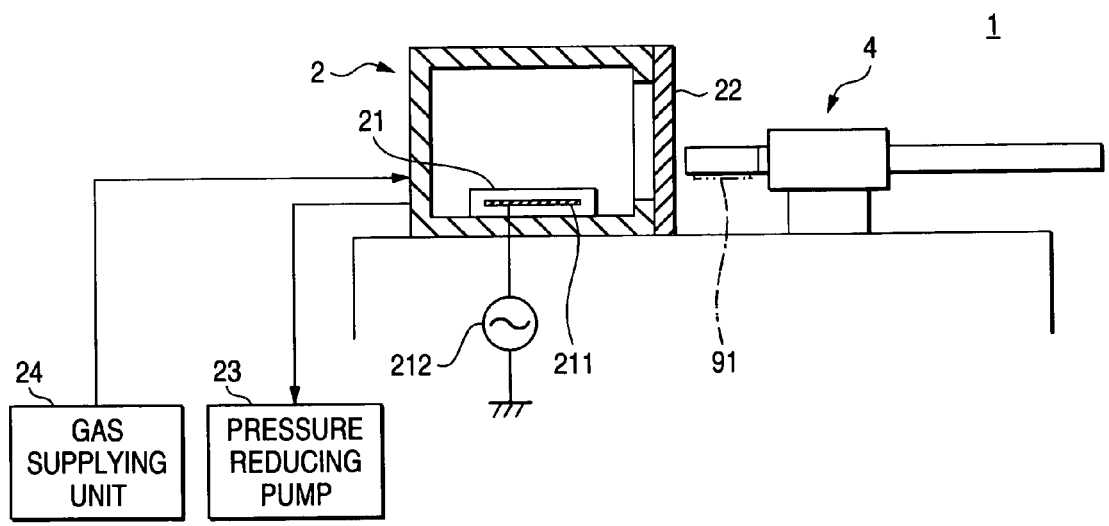
FIG. 2 is a side view showing a construction of the electronic part mounting apparatus.
Figure 3:
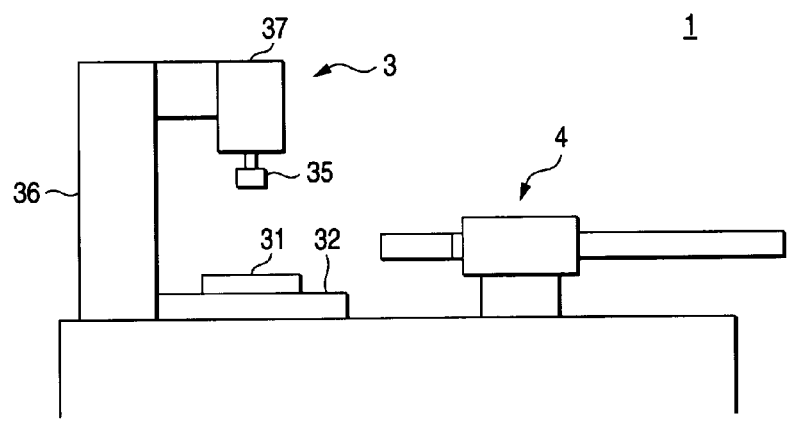
FIG. 3 is another side view showing a construction of the electronic part mounting apparatus.

FIG. 1 is a plan view showing a construction of an electronic part mounting apparatus 1 which is an embodiment of the present invention. FIGS. 2 and 3 are side views showing the electronic part mounting apparatus. As shown in FIG. 1, in an electronic part mounting apparatus 1, a chamber 2, a mounting mechanism 3 and a conveying robot 4 are provided on a base 10. FIG. 2 shows a structure including the chamber 2 and the conveying robot 4 as viewed from side. FIG. 3 shows a structure including the mounting mechanism 3 and the conveying robot 4 as viewed from side.

As shown in FIGS. 1 and 2, the chamber 2 includes a stage 21 therein. The stage 21 is an electrostatic chuck for electrostatically attracting a substrate 91 and an electronic part 92 (for example, a film substrate and a semiconductor IC pair chip). Further, as shown in FIG. 2, an electrode 211 for generating plasma is provided within the stage 21, and is connected to a radio-frequency power source 212. A gate 22, which may be opened and closed, is provided on a side surface of the chamber 2, located closer to the conveying robot 4. A pressure reducing pump 23 and a gas supplying unit 24 are connected to the chamber 2.

The mounting mechanism 3, as shown in FIGS. 1 and 3, includes a stage 31 for suction-attractively holding the substrate 91 and a mounting head 35 for suction-attractively holding the electronic part 92. The stage 31 is movable in a horizontal plane by an X-Y table 32. The mounting head 35 is vertically movable by a head lifting mechanism 36, and rotatable about a vertically extending axis by a head turning mechanism 37.

The conveying robot 4 is constructed such that, as shown in FIG. 1, a moving block 42 is moved on and along a guide rail 41 by a ball screw mechanism and a motor. Two arms 431 and 432 are attached to the moving block 42. The arms 431 and 432 are movable to and from the chamber 2 (and mounting mechanism 3) by a related mechanism within the moving block 42. A support plate 441 which attracts and holds the substrate 91 on the lower surface by suction-attraction is fixed to a tip end of the arm 431. A holder plate 442 which attracts and holds the electronic part 92 by suction-attraction is attached to a tip end of the arm 432 in a state that a rotary part 443 is interposed between them. The holder plate 442 may be turned upside down about the rotary part 443 and about arm 432.

Figure 4:
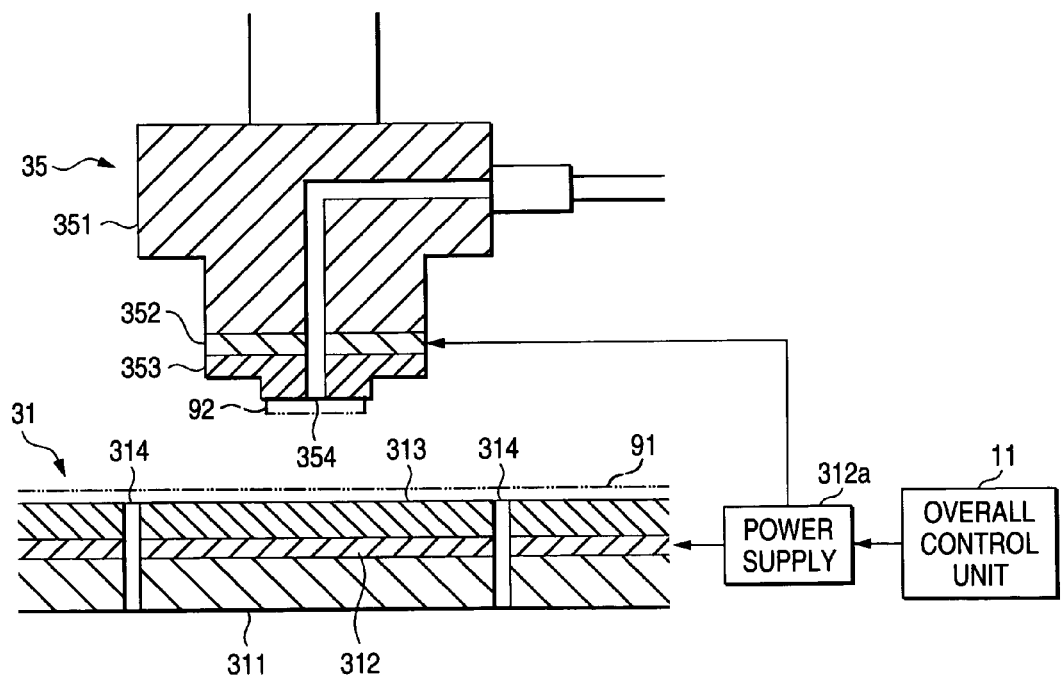
FIG. 4 is an enlarged cross sectional view showing a structure including a stage and a mounting head in the electronic part mounting apparatus.

FIG. 4 is an enlarged, cross sectional view showing a structure including the stage 31 and the mounting head 35 in the mounting mechanism 3. The stage includes a multilayered structure consisting of a base plate 311, a ceramic heater 312, and an attraction plate 313 for holding the substrate 91, which are layered in this order from the lower side. A plurality of suction ports 314 are formed extending through and across the stage 31. The ceramic heater 312 is connected to a power supply 312a, which is controlled by an overall control unit 11 for controlling overall operations of the electronic part mounting apparatus 1. The suction ports 314 are connected to an ejector (not shown), and a switching between suction and non-suction operations through the suction ports 314 are also controlled by the overall control unit 11.

The mounting head 35 has a multilayered structure consisting of a body block 351, a ceramic heater 352, an attracting tool 353 for holding the electronic part 92 by suction-attraction, which are layered one on another in this order from the upper side. An attraction port 354 extends through the multilayered structure of the mounting head. The ceramic heater 352 is also connected to the power supply 312a, and is under control of the overall control unit 11. Switching between suction and non-suction operations through the attraction port 354 are also controlled by the overall control unit 11.

Figure 5:
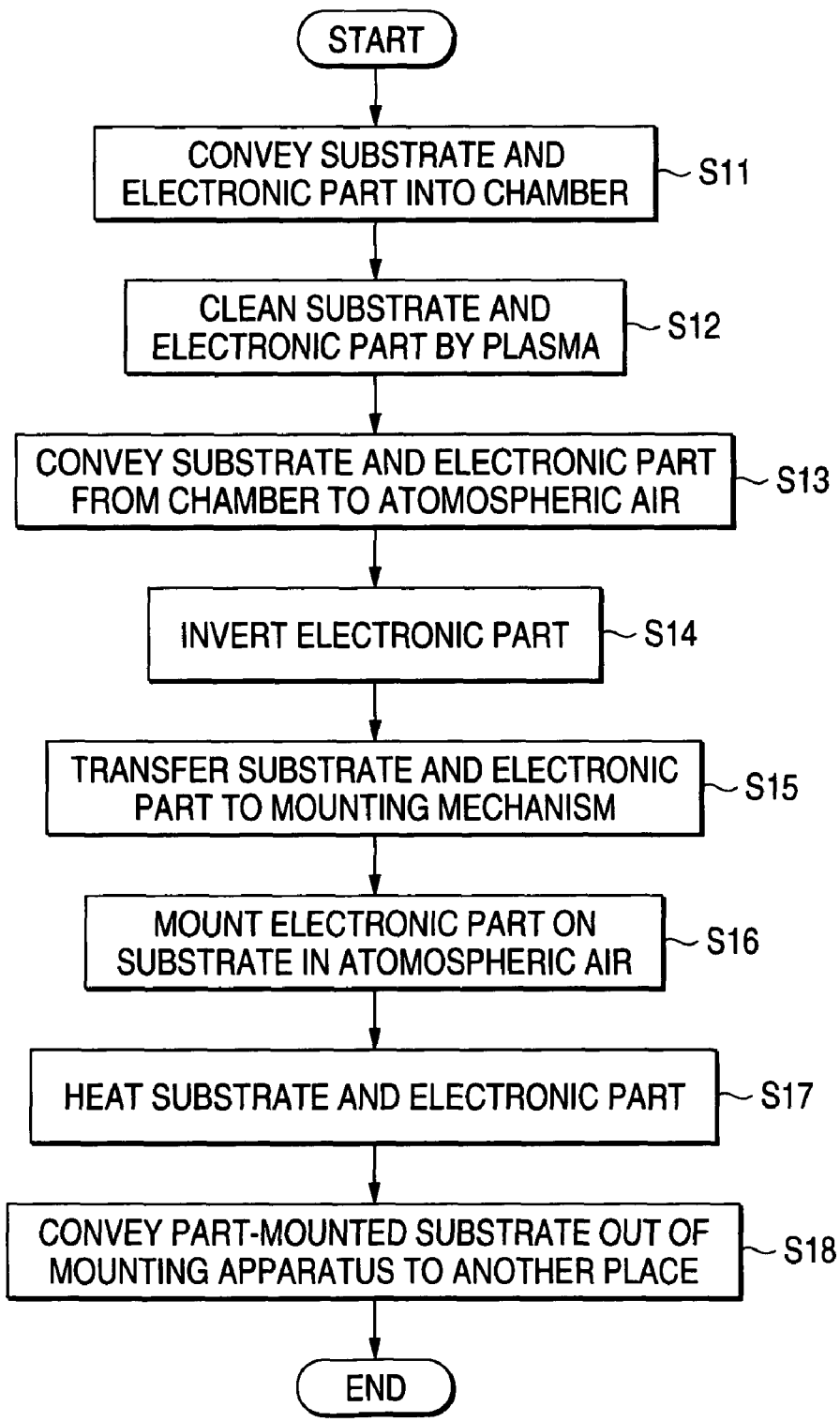
FIG. 5 is a flow chart showing a flow of operation of the electronic part mounting apparatus.

FIG. 5 is a flow chart showing a flow of operations of the electronic part mounting apparatus 1 (and operations to the electronic part mounting apparatus).

Before the electronic part mounting apparatus 1 is operated, the substrate 91 and the electronic part 92 are conveyed into the chamber 2 and placed on the stage 21 by the conveying device (step S11). In the chamber 2, the stage 21 attractively holds the substrate 91 and the electronic part 92.

Thereafter, the gate 22 is closed, and air of the chamber 2 is exhausted by the pressure reducing pump 23 shown in FIG. 2 to be high vacuum condition. Further, a predetermined kind of gas, such as argon gas, is supplied from the gas supplying unit 24 to the chamber 2, whereby a predetermined atmosphere is set up in an internal space of the chamber 2. High frequency electric power is supplied from the radio-frequency power source 212 to the electrode 211 of the stage 21, so that a plasma is generated between the inner wall of the chamber 2 and the stage 21. Unwanted materials absorbed on the electrodes (e.g., Au (gold) electrode) of the substrate 91 or the electronic part 92, such as water and organic materials, are removed by the plasma. Further, the surfaces of the electrodes are etched and modified by the plasma exciting, whereby a called plasma cleaning process is performed (step S12).

Figure 6:
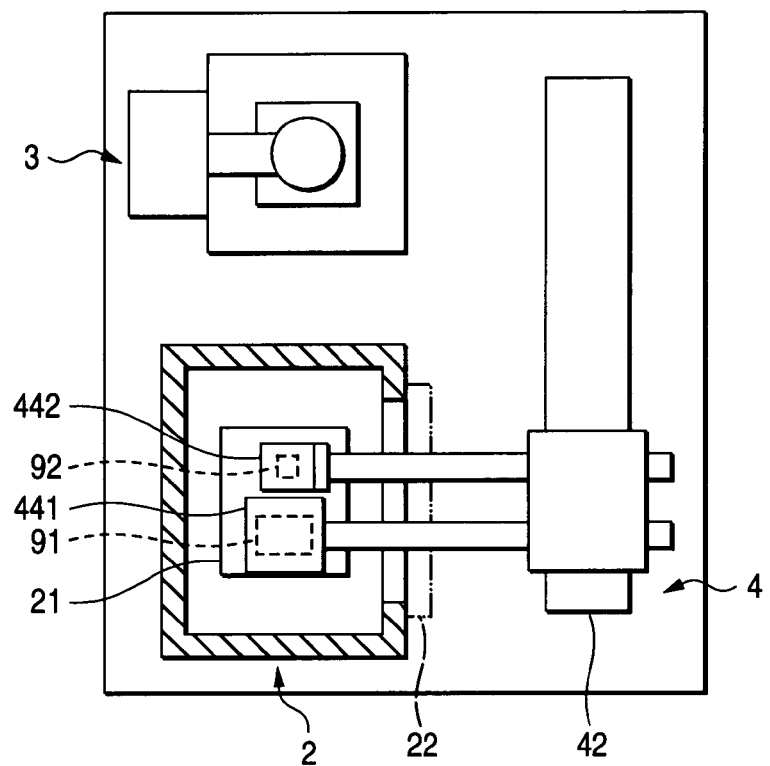
FIG. 6 is a plan view showing a stage of operation of the electronic part mounting apparatus.

Upon completion of the plasma cleaning process, the pressure in the chamber 2 is returned to the atmospheric pressure, the gate 22 is opened, and the support plates 441 and 442 are inserted into the chamber 2 by the conveying robot 4 as shown in FIG. 6. At this time, the holder plate 442 is turned and its attraction surface is directed downward. The support plates 441 and 442 are slightly moved downward by the related mechanism in the moving block 42 and respectively abut on the substrate 91 and the electronic part 92. The suction ports of the support plates 441 and 442 are each shaped like a trapezoidal protrusion protruded from the suction side surface. The support plates 441 and 442 having the suction ports so shaped abut on the areas of the substrate 91 and the electronic part 92 except the electrodes thereof.

Figure 7:
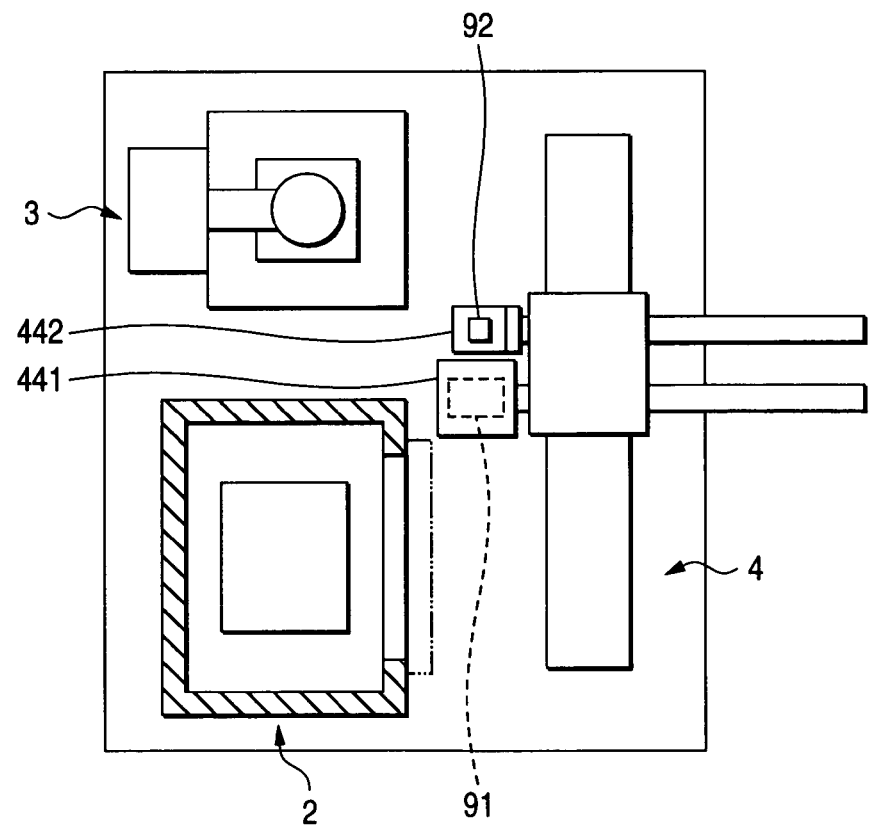
FIG. 7 is a plan view showing another stage of the operation of electronic part mounting apparatus.

Then, the attraction by the stage 21 is removed, and the support plates 441 and 442 start their attracting operations to attractively hold the substrate 91 and the electronic part 92. The support plates 441 and 442 are slightly moved upward and moved from the chamber 2 to outside to thereby convey the substrate 91 and the electronic part 92 from the chamber 2 to outside (step S13). As a result, the substrate 91 and the electronic part 92 are exposed to the atmospheric air. At this time, the holder plate 442 is turned upside down, and the electronic part 92 is held on the upper surface of the holder plate as shown in FIG. 7 (step S14).

Figure 8:
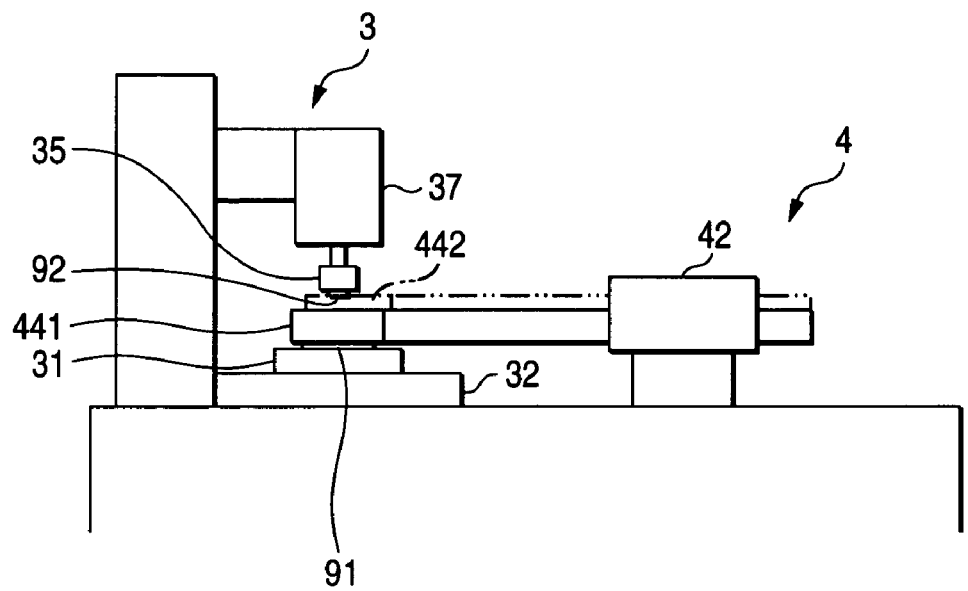
FIG. 8 is a plan view showing still another stage of the operation of electronic part mounting apparatus.

As indicated by a two-dot chain line in FIG. 8, the holder plate 442 is moved to a position right under the mounting head 35 of the mounting mechanism 3, and the mounting head 35 descends and abuts on the electronic part 92 on the holder plate 442. An attracting operation by the mounting head 35 starts, while at the same time the attractive holding by the holder plate 442 is removed. And, the electronic part 92 is held with the mounting head 35 in a state that the electrodes of the electronic part 92 are directed downward. The mounting head 35 is slightly moved upward and retracted to the moving block 42.

Subsequently, the support plate 441 is moved to right above the stage 31 of the mounting mechanism 3, and as shown in FIG. 8, the support plate 441 is slightly moved downward to cause the substrate 91 to abut on the stage 31. An attractive holding by the stage 31 starts, while at the same time the attractive holding by the support plate 441 is removed, and the substrate 91 is held with the stage 31. Thereafter, the support plate 441 is slightly moved upward and retracted to the moving block 42 (step S15).

Figure 9:
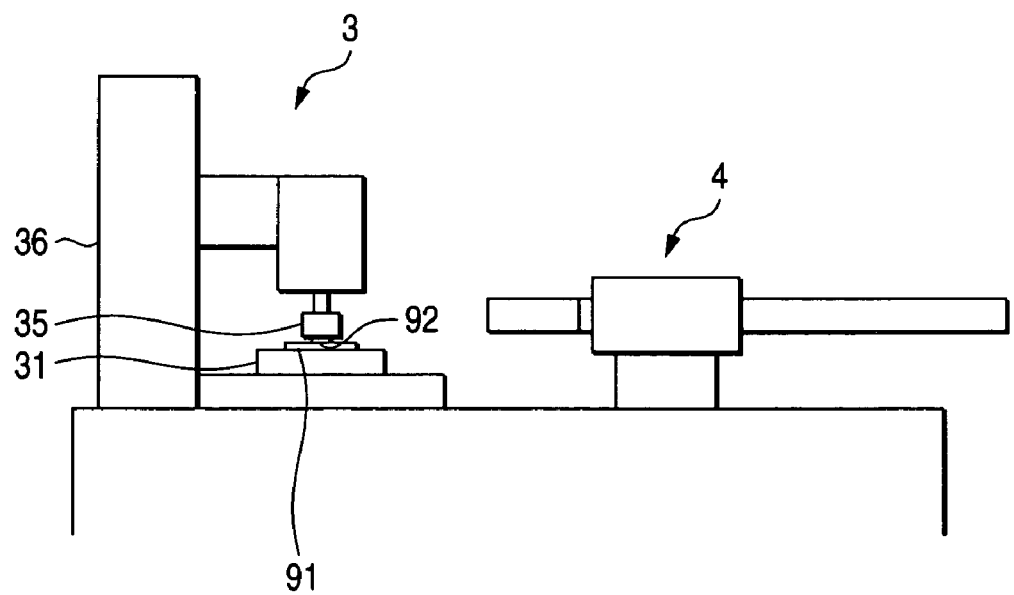
FIG. 9 is a plan view showing yet another stage of the operation of electronic part mounting apparatus.

When the substrate 91 and the electronic part 92 are transferred to the mounting mechanism 3, a camera (not shown) advances to between the stage 31 and the mounting head 35, and picks up a mounting region of the substrate 91 and a surface of the electronic part 92 closer to the electrode side thereof. Then, an image processor circuit computes an offset between the center of the mounting region on the substrate 91 and the center of the electronic part 92, and an angular offset of its rotation about the vertically extending axis. By using the thus computed offsets, the X-Y table 32 moves the stage 31 to align the center of the mounting region of the substrate 91 with the center of the electronic part 92, and the head turning mechanism 37 adjusts the orientation of the electronic part 92. Thereafter, as shown in FIG. 9, the mounting head 35 is moved downward by the head lifting mechanism 36, and the electronic part 92 is mounted on the substrate 91 in a state that it is exposed to the air (step S16).

In mounting the electronic part on the substrate, a force by which the mounting head 35 presses the electronic part 92 is controlled, and current is fed to the ceramic heaters 312 and 352 (see FIG. 4) in the stage 31 and mounting head 35 for a short time under control of the overall control unit 11. The heating of the ceramic heaters is stopped in the middle of temperature increasing of the substrate 91 and the electronic part 92 which are objects to be held with the stage 31 and the mounting head 35. As a result, the objects to be held are heated in a pulsed variation of temperature (viz., called "pulse heated"). In the pulse heat, in the pulse heat, a time duration near the peak is about 0.5 second. Bonding of the electrodes of the substrate 91 and the electronic part 92, viz., bonding between metal atoms by the atomic force, is reliable, and the electronic part 92 is firmly fixed to the substrate 91.

Upon completion of the mounting, the mounting head 35 stops its holding operation and ascends, and the stage 31 also stops its holding operation. The substrate 91 having the electronic part mounted thereon is conveyed to another place by the arms provided outside the electronic part mounting apparatus 1 (step S18). In a subsequent step, it is sealed with resin (called under fill encapsulation, side fill encapsulation, etc.).

As described above, in the electronic part mounting apparatus 1, the substrate 91 an the electronic part 92 are subjected to the plasma cleaning process within the chamber 2. Then, the substrate 91 and the electronic part 92 are conveyed to the atmospheric air. The electronic part 92 is mounted on the substrate 91 in a state that those are exposed to the atmospheric air. Description to follow is conditions to ensure a proper mounting of the electronic part 92 on the substrate 91 even if the mounting is carried out in a state that those are exposed to the atmospheric air.

Figure 10:
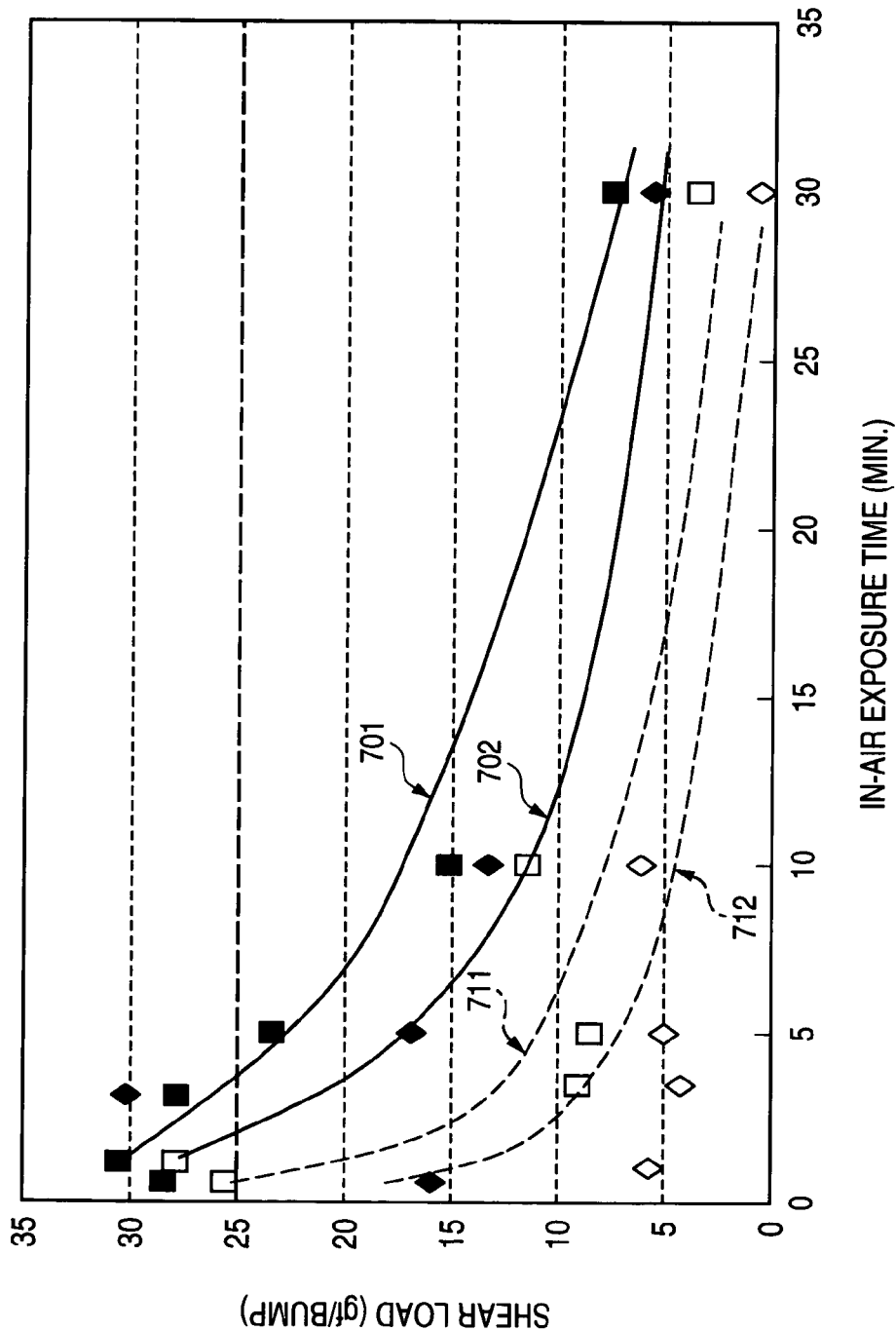
FIG. 10 is a graph showing shear load characteristics.

FIG. 10 is a graph showing a relationship between the time that the substrate 91 and the electronic part 92 are left exposed to the atmospheric air till the electronic part is mounted on the substrate and a force necessary for removing (peeling) the electronic part 92 from the substrate 91 after the mounting of the electronic part. A shear load plotted on the ordinate of the graph is obtained by dividing a load which is imparted to the electronic part 92 in a direction parallel to a major surface of the substrate 91 when the mounting of the electronic part 92 is removed, by the number of bumps as the electrodes. The load imparted at the time of the mounting of the electronic part is mounted (i.e., a pressing force to the electronic part 92) is set at a value which will enable the electronic part to properly be mounted on the substrate.

In FIG. 10, a solid curve 701 indicates a characteristic of the shear load when the pulse heating is carried out at 150° C. near the peak in the mounting mechanism 3. A solid curve 702 indicates a shear load characteristic when the pulse heating is carried out at 100° C. near the peak in the mounting mechanism. Broken curves 711 and 712 are presented for reference. Those curves indicate shear load characteristics when the substrate 91 is continuously heated at 150° C. and 100° C. (i.e., the constant heat) for the mounting (viz., when the substrate 91 is left put on the heat plate placed in the air). Measurement results are indicated by black squares for the solid curve 701, black diamonds for the solid curve 702, white squares for a broken curve 711, and white diamonds for a broken curve 712.

As seen from comparison of the solid curve 701 and the broken curve or the solid curve 702 and the broken curve 712, a bonding strength when the substrate 91 is constant heated is greatly lower than that when it is pulse heated. The reason for this may be estimated in the following. Where the constant heat is used, the substrate 91 is left exposed to the air in a state that it is heated. Accordingly, oxidization of the electrode surface is promoted.

In the test, it is preferable that a load of 25 gf or larger is required to peel one bump in a shearing direction. When the pulse heat of 150° is used, a time (referred to as "in-air leaving time") from as time that the ambient of the substrate 91 and the electronic part 92 is put in an atmospheric air after the plasma cleaning is carried out till the electronic part is mounted on the substrate, is preferably within 5 minutes (even if it is estimated to be longish, based on the solid curve 701). Similarly, when the pulse heat of 100° C. is used, the in-air leaving time is preferably within 3 minutes on the basis of the solid curve 702.

The shorter the in-air leaving time is, the more preferable it is, as a matter of course. It is preferable that the electronic part mounting apparatus 1 ceaselessly operates during a time from the opening of the chamber 2 to the mounting of the electronic part. The pulse heat having the temperature up to about 300° C. will be used, and various shaped of the electrodes are used. When considering those facts, at least the in-air leaving time is preferably within 10 minutes.

As described above, where the electronic part mounting apparatus 1 is used, the substrate 91 and the electronic part 92 are plasma cleaned, and then the electronic part 92 is swiftly mounted on the substrate 91 in a state that those are exposed in the atmospheric air. Accordingly, the necessity of using the complicated mechanism for mounting the electronic part 92 on the substrate in the pressure-reduced condition is eliminated. The structure of the electronic part mounting apparatus 1 is simplified. Improvement of the throughput and considerable reduction of cost to manufacture the apparatus are achieved.

If the time is controlled so as to satisfy the conditions derived from the graph of FIG. 10, and the electronic part is swiftly mounted on the substrate, the electronic part 92 is bonded to the substrate 91 at an appropriate bonding strength even at low temperature, for example, 150° to 100° C. or 100° C. or lower. As a result, the electronic part is bonded to a film substrate which is low in heat resistance and high in thermal expansion coefficient, by fine-pitch bonding.

If bumps are formed at the electrodes on the substrate 91 and the electronic part 92, in the present invention, those are bonded together without greatly crashing the bumps, unlike the conventional technique. Accordingly, when thermal stress is generated in the bonding part, the stress less concentrates on the bonding part. Further, since a quantity of deformation of the bump is small, wetting property of the under fill is good in a sealing process carried out in a subsequent step. Additionally, the resin sealing time is reduced, the bubble remaining is reduced, and the resin used may be selected from among many kinds of resins.

Figure 11:
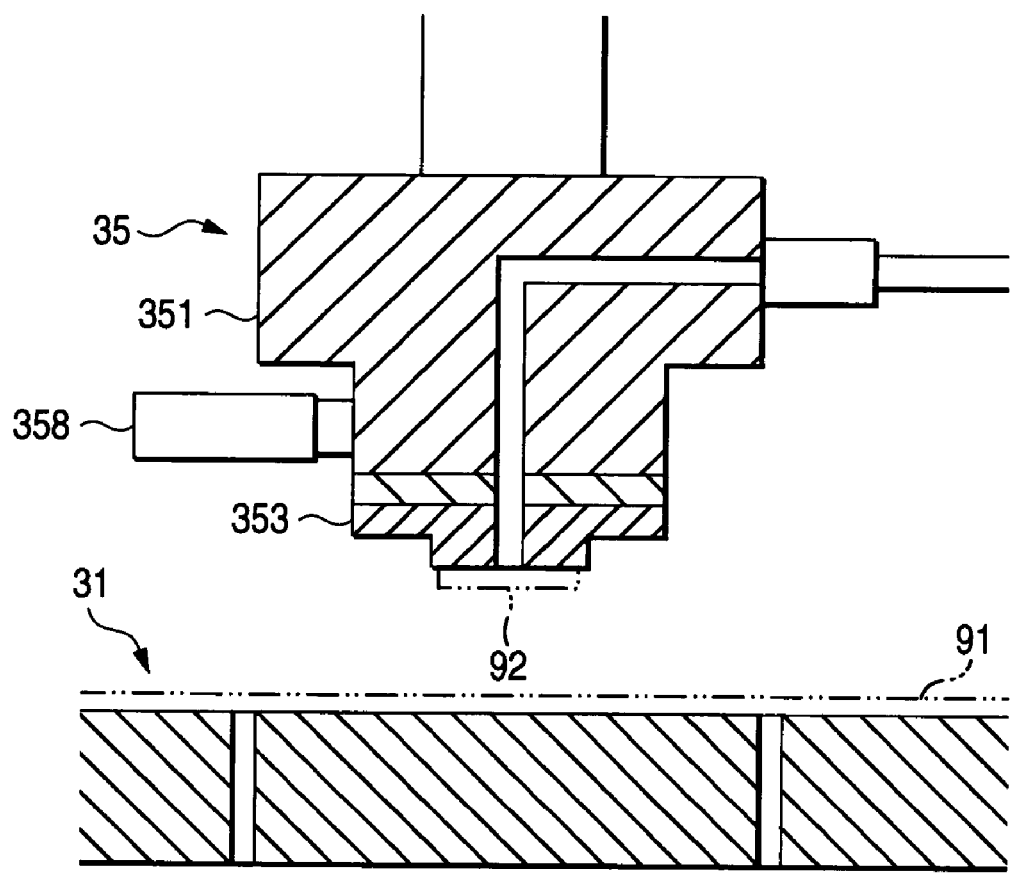
FIG. 11 is a cross sectional view showing another construction of the combination of the stage and the mounting head.

FIG. 11 is a diagram showing another mounting head 35 in the electronic part mounting apparatus 1. In a mounting head 35 shown in FIG. 1, the ceramic heater 352 is removed from the mounting head 35 shown in FIG. 4, and a vibration device 358 for vibrating the mounting head 35 at an ultrasonic frequency is additionally provided. The ceramic heater 312 shown in FIG. 4 is removed also from the stage 31. When the electronic part 92 is mounted on the substrate 91, the vibration is applied from the vibration device 358 to the electronic part 92 through the body block 351 and the attracting tool 353.

With this structure, the electrodes of the substrate 91 are bonded to those on the electronic part 92 at normal temperature (for example, 25° C.). Also when the ultrasonic vibration is utilized, to suppress the oxidization of the electrodes activated by the plasma cleaning, and the absorption of pollutant materials by the electrodes, it is preferable that the electronic part 92 is swiftly mounted on the substrate 91 after those are put in an atmospheric air. The ultrasonic vibration and the pulse heat may be combined in use.

While specific embodiments of the invention have been described, it should be understood that the invention is not limited to the above-mentioned ones, but may variously be modified, altered and changed within the true spirits of the invention.

For example, the substrate 91 and the electronic part 92 are plasma cleaned in one chamber 2 in the embodiment mentioned above. If required, the substrate 91 and the electronic part 92, respectively, may be cleaned in different chambers 2 which are used exclusively for them. The plasma cleaning process is based not only on the normal plasma process, but also on the plasma process by DC current, pulse current, magnetron or the like. Additionally, a process including the plasma, such as fast atom beam (FAB) or ion beam, may be utilized as a kind of the plasma cleaning. Nitrogen, oxygen, fluorine, hydrogen or the like may be used for the gas for the plasma cleaning, in addition to argon.

After the electronic part is mounted on the substrate, the resultant structure is pulse heated in the above-mentioned embodiment. The substrate is mounted on the electronic part, and at substantially the same time (i.e., immediately after the mounting) the resultant structure may be pulse heated. When those are heated after the mounting of them, another heating, not the pulse heating, may be used. For example, after the heating process is stopped, the temperature may be kept. It is preferable to heat both the substrate 91 and the electronic part 92. Either of them may be heated unless the bending strength is decreased considerably. Further, either of them may be constant heated. Preferably, the stage 31 and the mounting head 35 are provided with cooling mechanisms so as to block the transfer of heat to other locations.

The heaters for heating the stage 31 and the mounting head 35 may be other heaters than heating wires.

The electrodes of the substrate 91 and the electronic part 92 may be made not only of gold but also of any of copper, aluminum and tin, or may be electrodes plated with any of those materials. The substrate 91 may be not only a film substrate made of polyimide, PET (polyethylene terephthalate) or the like, but also a plate-like substrate made of resin or ceramics.

The electronic part mounting apparatus 1 is well adaptable for the mounting of an electronic part 92 having discrete electrodes, typically the IC pair chip. If required, it may be applied to the mounting of other electronic parts 92.

A mechanical chuck may be used for holding the substrate 91 and the electronic part 92 in the mounting mechanism 3. Any mounting mechanism if it allows the electronic part 92 to move relative to the substrate 91 may be used for the holding them.

As seen from the foregoing description, the present invention succeeds in simplifying the construction of the electronic part mounting apparatus, improving the throughput, and considerably reducing the cost of manufacturing the apparatus. Further, the invention enables the electronic part to be mounted on the substrate at low temperature.

What is claimed is:

1. An electronic part mounting apparatus for mounting an electronic part on a substrate, comprising:
   a chamber for cleaning a substrate and an electronic part by plasma;
   a conveying mechanism for conveying said electronic part and said substrate from said chamber into atmospheric air;
   a mounting mechanism for receiving said electronic part and said substrate from said conveying mechanism and for mounting said electronic part on said substrate in a state that said electronic part and said substrate are exposed in the atmospheric air.

2. An electronic part mounting apparatus according to claim 1,
   wherein said mounting mechanism includes a part holder for holding said electronic part, a substrate holder for holding said substrate, and a moving mechanism for moving said part holder relative to said substrate holder, and
   one of said part holder and said substrate holder includes a heating portion for heating objects to be held after said electronic part is mounted on said substrate.

3. An electronic part mounting apparatus according to claim 2, wherein heating operation of said heating portion is stopped in the middle of temperature increasing of said objects to be held.

4. An electronic part mounting apparatus according to claim 2, wherein both said part holder and said substrate holder include said heating portions.

5. An electronic part mounting apparatus according to claim 1, further comprising an ultrasonic vibration source for applying an ultrasonic vibration to said part holder.

6. An electronic part mounting apparatus according to claim 1, further comprising a stage for placing said electronic part and said substrate thereon in said chamber.

7. An electronic part mounting apparatus according to claim 1, wherein said substrate and said electronic part are cleaned in one chamber.

* * * * *